(12) United States Patent
Byers et al.

(10) Patent No.: US 8,844,609 B2
(45) Date of Patent: Sep. 30, 2014

(54) COOLING MANIFOLD

(75) Inventors: Charles C. Byers, Wheaton, IL (US); William H. Scofield, Batavia, IL (US)

(73) Assignee: Alcatel Lucent, Boulogne-Billancourt (FR)

( * ) Notice: Subject to any disclaimer, the term of this patent is extended or adjusted under 35 U.S.C. 154(b) by 1301 days.

(21) Appl. No.: 12/381,385

(22) Filed: Mar. 11, 2009

(65) Prior Publication Data

US 2010/0230079 A1    Sep. 16, 2010

(51) Int. Cl.
*H01L 23/473*    (2006.01)
*F28F 7/02*    (2006.01)

(52) U.S. Cl.
CPC *H01L 23/473* (2013.01); *F28F 7/02* (2013.01)
USPC .......................................... 165/80.4; 361/699

(58) Field of Classification Search
USPC ........................... 165/80.4, 168, 170; 361/699
See application file for complete search history.

(56) References Cited

U.S. PATENT DOCUMENTS

| | | | |
|---|---|---|---|
| 4,315,300 A * | 2/1982 | Parmerlee et al. | 361/703 |
| 5,057,968 A * | 10/1991 | Morrison | 361/700 |
| 5,125,451 A * | 6/1992 | Matthews | 165/80.4 |
| 5,251,097 A | 10/1993 | Simmons et al. | |
| 5,285,347 A * | 2/1994 | Fox et al. | 361/699 |
| 5,323,847 A | 6/1994 | Koizumi et al. | |
| 5,999,404 A | 12/1999 | Hileman | |
| 6,152,215 A * | 11/2000 | Niggemann | 165/166 |
| 6,366,461 B1 | 4/2002 | Pautsch et al. | |
| 6,508,301 B2 * | 1/2003 | Marsala | 165/80.4 |
| 6,580,609 B2 | 6/2003 | Pautsch | |
| 7,017,655 B2 * | 3/2006 | Wilson et al. | 165/80.4 |
| 7,156,159 B2 * | 1/2007 | Lovette et al. | 165/104.33 |
| 8,004,841 B2 * | 8/2011 | Cipolla et al. | 361/699 |
| 8,096,348 B2 * | 1/2012 | Takagi et al. | 165/170 |
| 2002/0148596 A1 * | 10/2002 | Werninger | 165/96 |
| 2007/0151707 A1 | 7/2007 | Lyons et al. | |
| 2009/0034327 A1 * | 2/2009 | Yun et al. | 365/174 |

OTHER PUBLICATIONS

U.S. Appl. No. 12/011,402, filed Jan. 25, 2008, Fair et al.

* cited by examiner

*Primary Examiner* — Allen Flanigan
(74) *Attorney, Agent, or Firm* — Jay Brown Law Firm; Jay M. Brown (57) ABSTRACT

Apparatus including cooling manifold, having metal cooling body and metal cooling block. Metal cooling body has internal passageway. Metal cooling block extends away from metal cooling body. Metal cooling block has surface oriented for being placed adjacent to and in substantially direct thermal communication with an electronic component located at distance away from metal cooling body. Cooling manifold is configured for circulating a working fluid through internal passageway and for precluding passage of the working fluid from metal cooling body into metal cooling block. Method that includes providing electronic component and cooling manifold. Provided cooling manifold includes metal cooling body and metal cooling block; metal cooling body has internal passageway; metal cooling block extends away from metal cooling body; metal cooling block has surface oriented adjacent to and in substantially direct thermal communication with electronic component being located at distance away from metal cooling body. Method also includes causing working fluid to be circulated through internal passageway while precluding passage of working fluid from metal cooling body into metal cooling block, such that heat is transferred from electronic component to working fluid.

20 Claims, 9 Drawing Sheets

COOLING MANIFOLD

BACKGROUND OF THE INVENTION

1. Field of the Invention

This invention generally relates to apparatus and methods for removing heat from an electronic component.

2. Related Art

This section introduces aspects that may help facilitate a better understanding of the invention. Accordingly, the statements of this section are to be read in this light and are not to be understood as admissions about what is prior art or what is not prior art.

Various types of apparatus and methods exist for removing heat from an electronic component. Such apparatus have included systems for spraying electronic components with a liquid coolant or for blowing cool air over the electronic components. Despite these developments, there is a continuing need for improved apparatus and methods for conducting heat away from electronic components.

SUMMARY

In an example of an implementation, an apparatus is provided that includes a cooling manifold. The cooling manifold includes a metal cooling body and a metal cooling block. The metal cooling body has an internal passageway. The metal cooling block extends away from the metal cooling body. The metal cooling block has a surface oriented for being placed adjacent to and in substantially direct thermal communication with an electronic component located at a distance away from the metal cooling body. The cooling manifold is configured for circulating a working fluid through the internal passageway and for precluding passage of the working fluid from the metal cooling body into the metal cooling block.

As another example of an implementation, a method is provided. The method includes providing an electronic component and a cooling manifold. The cooling manifold includes a metal cooling body and a metal cooling block. The metal cooling body has an internal passageway. The metal cooling block extends away from the metal cooling body. The metal cooling block has a surface oriented adjacent to and in substantially direct thermal communication with the electronic component. The electronic component is located at a distance away from the metal cooling body. The method also includes causing a working fluid to be circulated through the internal passageway while precluding passage of the working fluid from the metal cooling body into the metal cooling block, such that heat is transferred from the electronic component to the working fluid.

Other apparatus, methods, features and advantages of the invention will be or will become apparent to one with skill in the art upon examination of the following figures and detailed description. It is intended that all such additional apparatus, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
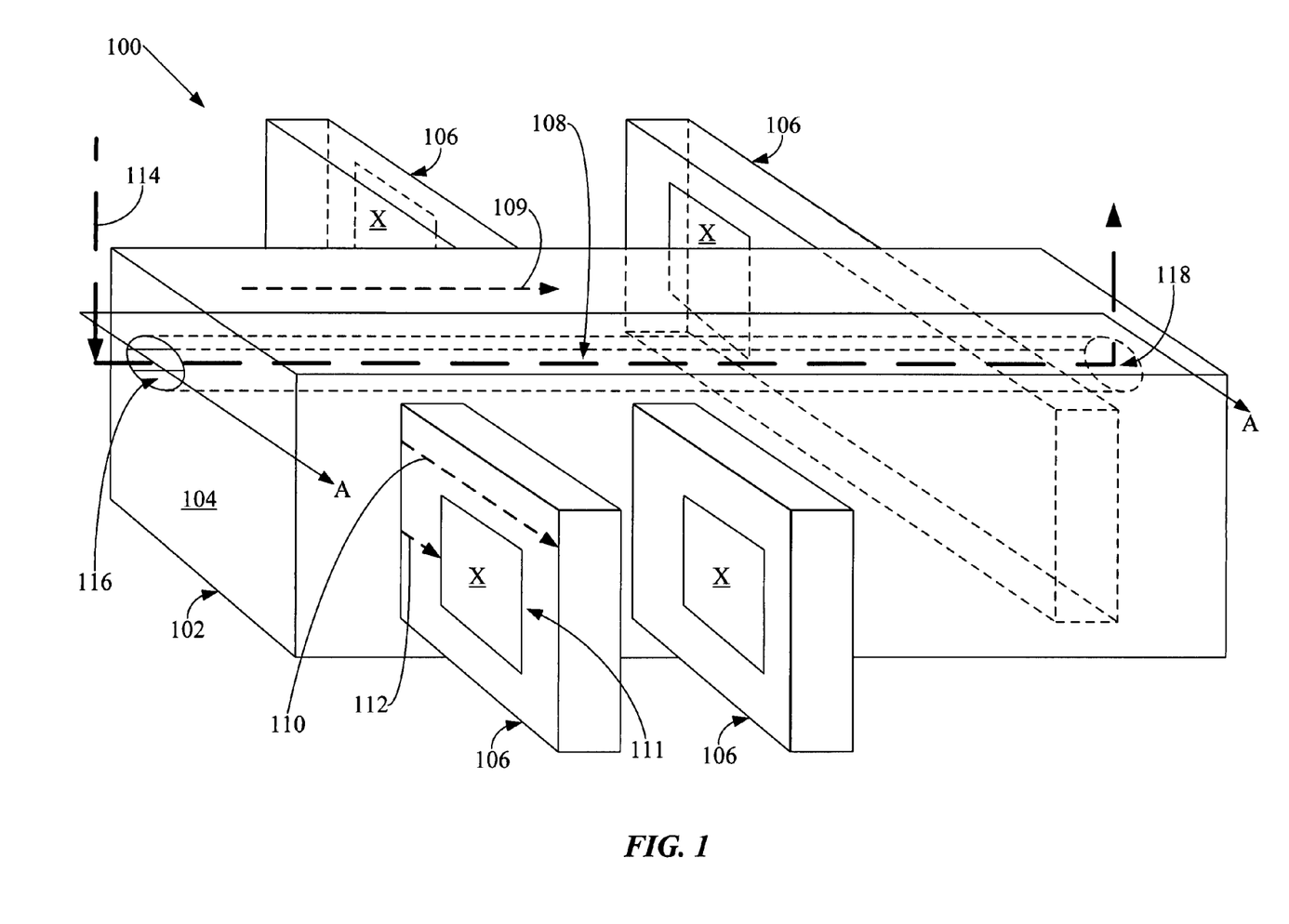
FIG. 1 is a perspective view showing an example of an implementation of an apparatus.
Figure 2:
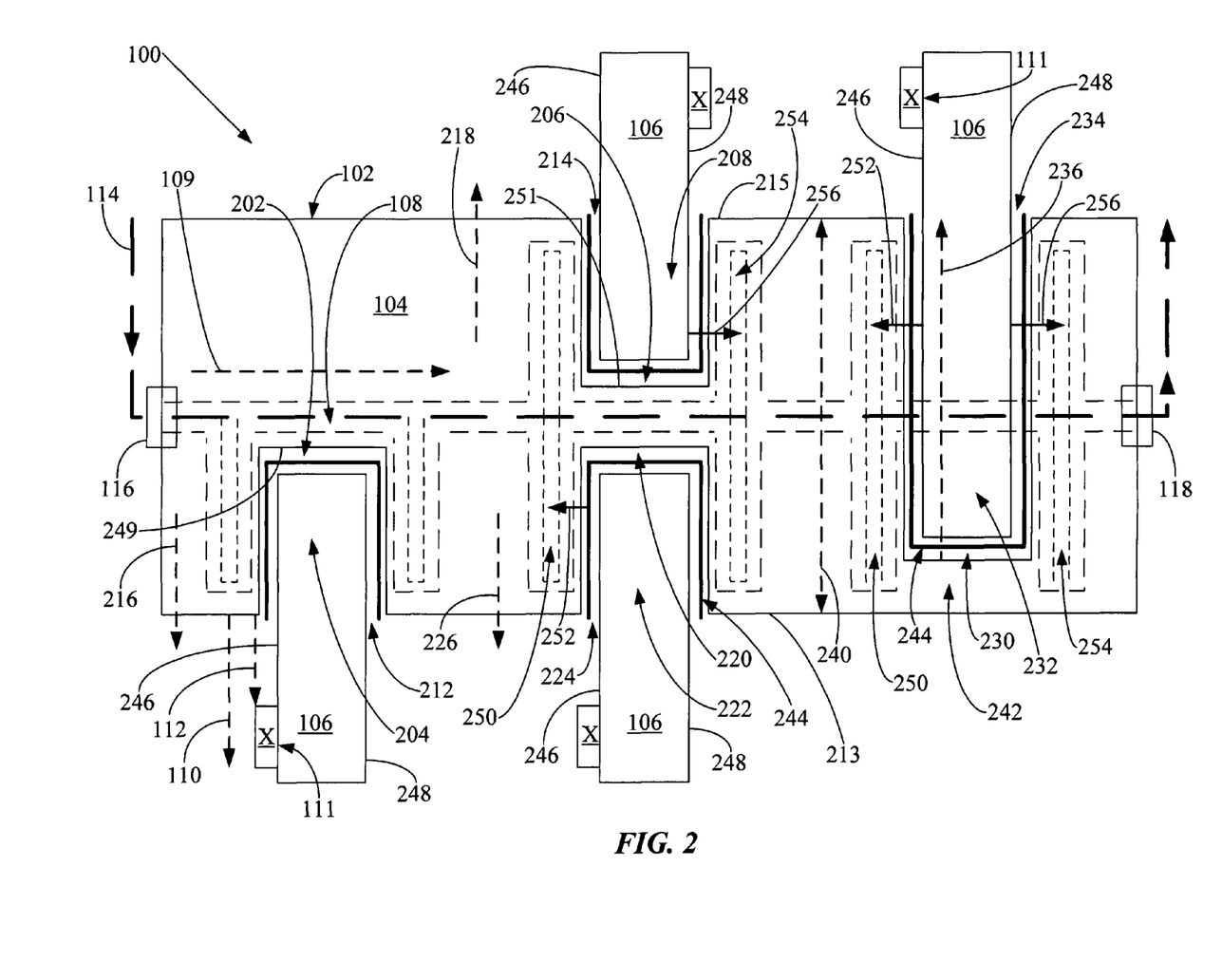
FIG. 2 is a cross-sectional view, taken along the line A-A, of the apparatus shown in FIG. 1.

FIG. 1 is a perspective view showing an example of an implementation of an apparatus 100. FIG. 2 is a cross-sectional view, taken along the line A-A, of the apparatus 100 shown in FIG. 1. The apparatus 100 includes a cooling manifold 102. The cooling manifold 102 has a metal cooling body 104 and one or a plurality of metal cooling blocks 106. The metal cooling body 104 has an internal passageway 108 extending along a first direction represented by an arrow 109. A metal cooling block 106 extends away from the metal cooling body 104 along a second direction represented by an arrow 110. The second direction 110 is transverse to the first direction 109. The first direction 109 may be perpendicular to the second direction 110. The metal cooling block 106 has a surface 111 oriented for being placed adjacent to and in substantially direct thermal communication with an electronic component X located at a distance represented by an arrow 112 away from the metal cooling body 104. A joint material such as a thin layer of a thermally-conductive paste or grease, or another suitable thermally-conductive material (not shown) may fill any narrow layer-like region between an electronic component X and the metal cooling block 106. It is understood with regard to the surface 111 that "substantially direct" thermal communication means that either the electronic component X is in direct contact with the surface 111, or the electronic component X is in direct contact with such a joint material that is in direct contact with the surface 111. The cooling manifold 102 is configured for circulating a working fluid (not shown) on a fluid pathway schematically represented by a dashed line 114 that includes the internal passageway 108. The internal passageway 108 may approach near the one or plurality of metal cooling blocks 106. The internal passageway 108 precludes passage of the working fluid from the metal cooling body 104 into a metal cooling block 106. The metal cooling body 104 includes an inlet port 116 and an outlet port 118 for the internal passageway 108. The cooling manifold 102 confines the working fluid within the internal passageway 108 between the inlet port 116 and the outlet port 118. The internal passageway 108 may keep the working fluid away from the electronic components X, serving to also prevent any working fluid that may escape the metal cooling body 104 from making contact with and damaging the electronic components X.

The cooling manifold 102 may facilitate detachment of the metal cooling block 106 from and reattachment of the metal cooling block 106 to the metal cooling body 104. Since the internal passageway 108 precludes passage of the working fluid from the metal cooling body 104 into a metal cooling block 106, such detachment and reattachment may be carried out without a potential escape of the working fluid leading to possible damage of the electronic components X.

The metal cooling body 104 may include a first cavity 202 configured for receiving a portion 204 of a metal cooling block 106. The metal cooling body 104 may include a second cavity 206, configured for receiving a portion 208 of another metal cooling block 106. The first cavity 202 may have an opening 212 in a surface 213 of the metal cooling body 104, and the second cavity 206 may have an opening 214 in a surface 215 of the metal cooling body 104. The first and second cavities 202, 206 may be respectively configured for receiving portions 204, 208 of the metal cooling blocks 106. The first and second cavities 202, 206 may respectively have first and second cavity walls 249, 251, portions 204, 208 of first and second metal cooling blocks 106 being in the cavities 202, 206 and being in thermal communication with portions of the cavity walls 249, 251.

The opening 212 of the first cavity 202 faces away from the metal cooling body 104 in a first direction represented by an arrow 216. The opening 214 of the second cavity 206 faces away from the metal cooling body 104 in a second direction represented by an arrow 218. The openings 212, 214 of the cavities 202, 206 may face in generally opposite directions 216, 218. The metal cooling body 104 may include a third cavity 220 configured for receiving a portion 222 of a further metal cooling block 106. The third cavity 220 has an opening 224, in the surface 213 of the metal cooling body 104, configured for receiving the portion 222 of the further metal cooling block 106. The opening 224 of the third cavity 220 faces away from the metal cooling body 104 in a third direction represented by an arrow 226. The openings 212, 224 of the first and third cavities 202, 220 may face in generally similar directions 216, 226.

The metal cooling body 104 may include a fourth cavity 230, configured for receiving a portion 232 of an additional metal cooling block 106. The fourth cavity 230 has an opening 234 in the surface 215 of the metal cooling body 104, configured for receiving the portion 232 of the additional metal cooling block 106. The fourth cavity 230 may have a depth represented by an arrow 236 substantially traversing a width represented by an arrow 240 of the metal cooling body 104 except for a backstop region 242. It is understood that "substantially traversing" means that the backstop region 242 has a thickness in the directions of the arrow 240 selected as just being adequately large for maintaining structural integrity of the metal cooling body 104 during its operation. The metal cooling body 104 may include another cavity (not shown) having an opening in the surface 213 of the metal cooling body 104. The another cavity may be configured for receiving a portion of another metal cooling block 106, may be located adjacent to the fourth cavity 230 and having a depth 236 and substantially traversing the width 240 of the metal cooling body 104. The another cavity may be oriented in a direction opposite to the direction of the arrow 236.

Alternatively, a metal cooling block 106 may be modified (not shown) to include a cavity, and the metal cooling body 104 may be modified (not shown) to include a metal projection extending away from a surface 213, 215 and configured for insertion of a portion of the metal projection into the cavity of the modified metal cooling block 106. It is understood that the apparatus 100 may have any selected quantities of additional cavities 202, 206, 220, 230 each configured for receiving a portion 204, 208, 222, 232 of a metal cooling block 106 and having orientations in the metal cooling body 104 analogous to those discussed above.

The apparatus 100 may include joint materials 244 located between and in contact with the metal cooling body 104 and the metal cooling blocks 106. The joint materials 244 may be attached to or not attached to the metal cooling body 104, and may be attached to or not attached to a metal cooling block 106. Each of the joint materials 244 may include carbon fiber velvet, a compressible gasket, a clamp, a thin layer of a thermally-conductive paste or grease, another suitable thermally-conductive material, or a combination including two or more of the foregoing. A silicon thermal grease may be utilized. Each of the metal cooling blocks 106 may have a first side 246, and a second side 248 opposite the first side 246. The joint materials 244 may press against walls 249, 251 in cavities 202, 206, 220, 230 and against the sides 246, 248 of the metal cooling block 106. The portions 204, 208 of the first and second metal cooling blocks 106 may be in substantially direct thermal communication with portions of the cavity walls 249, 251. It is understood with regard to the portions 204, 208 of the first and second metal cooling blocks 106 that "substantially direct" thermal communication means that either the portions 204, 208 are in direct contact with portions of the cavity walls 249, 251, or the portions 204, 208 are in direct contact with such a joint material 244 that is in direct contact with the portions of the cavity walls 249, 251.

The internal passageway 108 may include first circuitous regions 250 that are located in the metal cooling body 104 and are located adjacent to and facing the first sides 246 of one or a plurality of the metal cooling blocks 106. Such first circuitous regions 250 are in thermal contact with, i.e., along directions represented by arrows 252, the adjacent first sides 246 of the metal cooling blocks 106. Additionally, the internal passageway 108 may include second circuitous regions 254 that are located in the metal cooling body 104 and are located adjacent to and facing the second sides 248 of one or a plurality of the metal cooling blocks 106. Such regions 254 are in thermal contact with, i.e., along directions represented by arrows 256, the adjacent second sides 248 of one or a plurality of the metal cooling blocks 106. In operation of the apparatus 100, heat flows away from the metal cooling blocks 106 in the directions of the arrows 252, 256.

Figure 3:
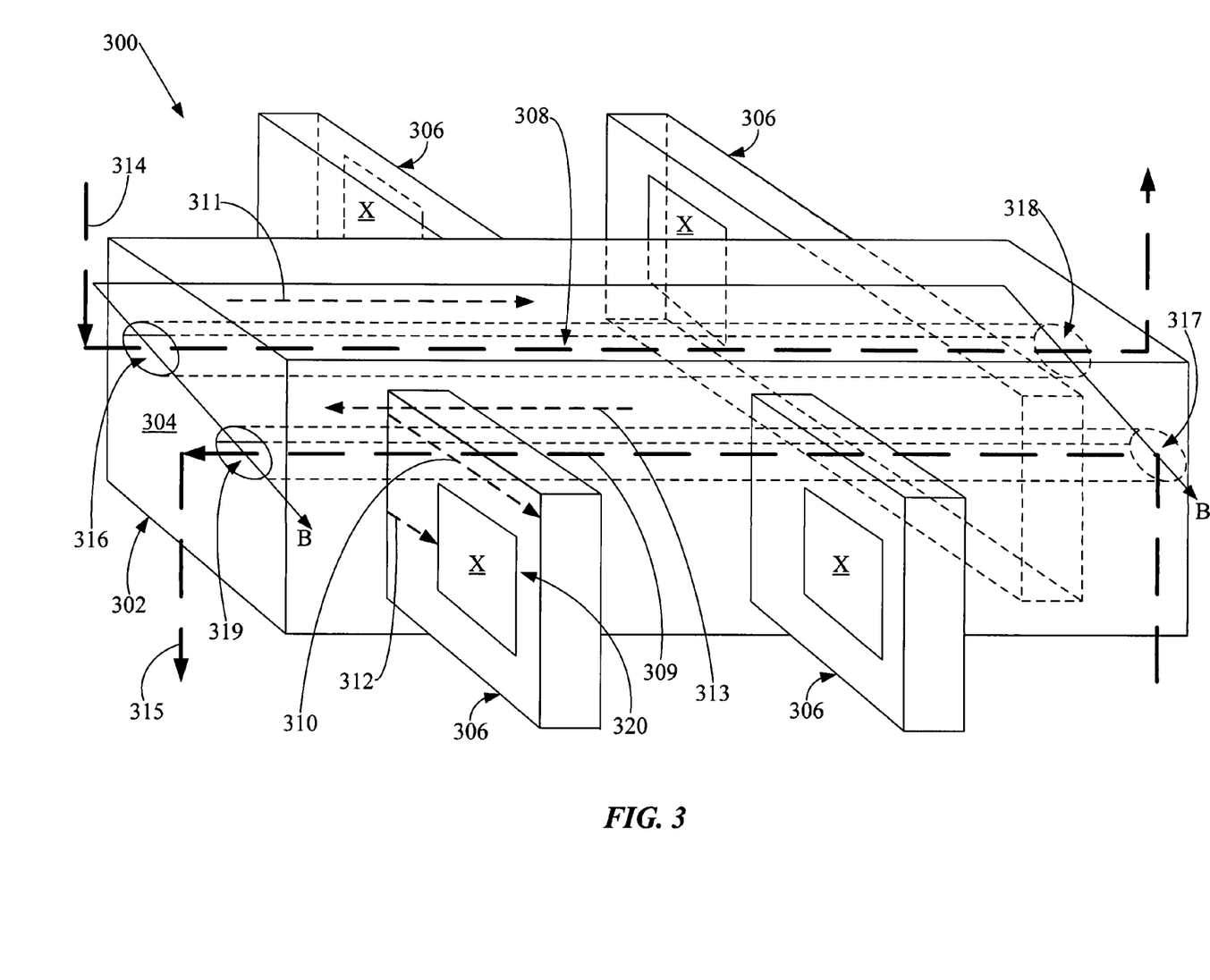
FIG. 3 is a perspective view showing another example of an apparatus.
Figure 4:
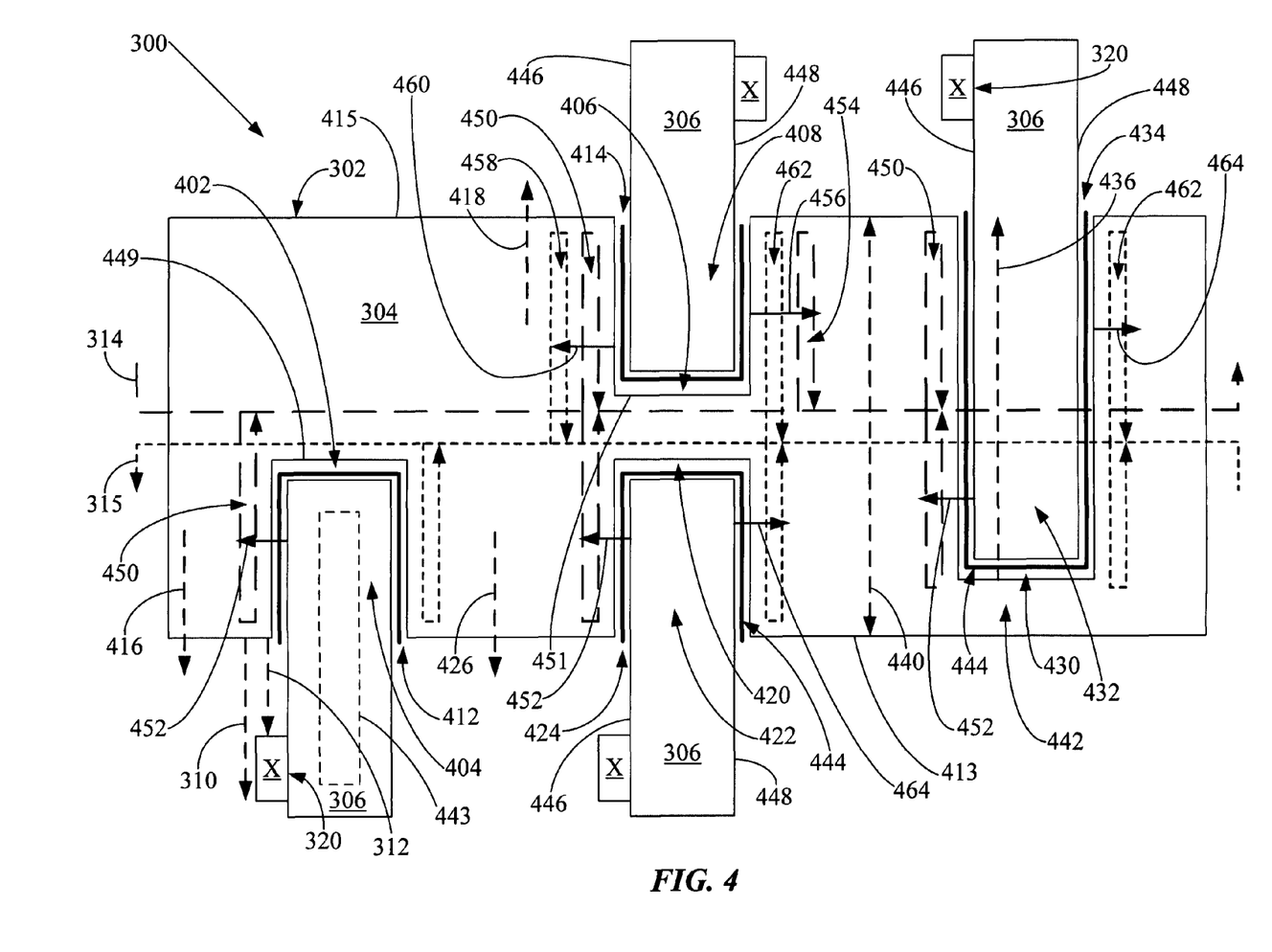
FIG. 4 is a cross-sectional view, taken along the line B-B, of the apparatus shown in FIG. 3.

FIG. 3 is a perspective view showing another example of an apparatus 300. FIG. 4 is a cross-sectional view, taken along the line B-B, of the apparatus 300 shown in FIG. 3. The apparatus 300 includes a cooling manifold 302. The cooling manifold 302 has a metal cooling body 304 and one or a plurality of metal cooling blocks 306. The metal cooling body 304 has an internal passageway 308 extending along a first direction represented by an arrow 311. The metal cooling body 304 has an internal passageway 309 extending along a second direction represented by an arrow 313. A metal cooling block 306 extends along a third direction represented by an arrow 310 away from the metal cooling body 304. The third direction 310 is transverse to the first and second directions 311, 313. The third direction 310 may be perpendicular to the first and second directions 311, 313. The metal cooling block 306 has a surface 320 oriented for being placed adjacent to and in substantially direct thermal communication with an electronic component X located at a distance represented by an arrow 312 away from the metal cooling body 304. A joint material, such as a thin layer of a thermally-conductive paste or grease, or another suitable joint material (not shown) may fill any narrow layer-like region between an electronic component X and the metal cooling block 306. The cooling manifold 302 is configured for circulating a working fluid (not shown) on a fluid pathway schematically represented by a dashed line 314 that includes the internal passageway 308. The internal passageway 308 may approach near the one or plurality of metal cooling blocks 306. The internal passageway 308 precludes passage of the working fluid from the metal cooling body 304 into a metal cooling block 306. The cooling manifold 302 is also configured for circulating the working fluid on a fluid pathway schematically represented by a dashed line 315 that includes the internal passageway 309. The internal passageway 309 also may approach near the one or plurality of metal cooling blocks 306. The internal passageway 309 precludes passage of the working fluid from the metal cooling body 304 into a metal cooling block 306. The fluid pathways 314, 315 may be spaced apart and isolated from each other. As an example, including two internal passageways 308, 309 respectively forming parts of two separated, isolated fluid pathways 314, 315 may enable the apparatus 300 to function despite inoperability of one of the fluid pathways 314, 315. Hence, the apparatus 300 may be able to remove heat from electronic components X despite a failure of a cooling function of one of the fluid pathways 314, 315. The metal cooling body 304 includes an inlet port 316 and an outlet port 318 for the internal passageway 308; and an inlet port 317 and an outlet port 319 for the internal passageway 309. The cooling manifold 302 confines the working fluid within the internal passageway 308 between the inlet port 316 and the outlet port 318, and within the internal passageway 309 between the inlet port 317 and the outlet port 319. The internal passageways 308, 309 may keep the working fluid away from the electronic components X, serving to also prevent any working fluid that may escape the metal cooling body 304 from making contact with and damaging the electronic components X. The cooling fluid may be pumped through the internal passageways 308, 309 in the metal cooling body 304 in generally opposite directions. Alternatively, the cooling fluid may be pumped through the internal passageways 308, 309 in the metal cooling body 304 in generally the same direction.

The cooling manifold 302 may be configured to enable repeated detachment of a metal cooling block 306 from and reattachment of a metal cooling block 306 to the metal cooling body 304. Since the internal passageways 308, 309 preclude passage of the working fluid from the metal cooling body 304 into a metal cooling block 306, such detachment and reattachment may be carried out without a potential escape of the working fluid leading to possible damage of the electronic components X.

The metal cooling body 304 may include a first cavity 402 configured for receiving a portion 404 of a metal cooling block 306. The metal cooling body 304 may include a second cavity 406, configured for receiving a portion 408 of another metal cooling block 306. The first cavity 402 may have an opening 412 in a surface 413 of the metal cooling body 304, and the second cavity 406 may have an opening 414 in a surface 415 of the metal cooling body 304. The first and second cavities 402, 406 may be respectively configured for receiving portions 404, 408 of the metal cooling blocks 306.

The first and second cavities 402, 406 may respectively have first and second cavity walls 449, 451, portions 404, 408 of first and second metal cooling blocks 306 being in the cavities 402, 406 and being in thermal communication with portions of the cavity walls 449, 451. The portions 404, 408 of the first and second metal cooling blocks 306 may be in substantially direct thermal communication with portions of the cavity walls 449, 451.

The opening 412 of the first cavity 402 may face away from the metal cooling body 304 in a first direction represented by an arrow 416. The opening 414 of the second cavity 406 may face away from the metal cooling body 304 in a second direction represented by an arrow 418. The openings 412, 414 of the cavities 402, 406 may face in generally opposite directions 416, 418. The metal cooling body 304 may include a third cavity 420, configured for receiving a portion 422 of a further metal cooling block 306. The third cavity 420 may have an opening 424, in the surface 413 of the metal cooling body 304, configured for receiving the portion 422 of the further metal cooling block 306. The opening 424 of the third cavity 420 may face away from the metal cooling body 304 in a third direction represented by an arrow 426. The openings 412, 424 of the first and third cavities 402, 420 may face in generally similar directions 416, 426.

The metal cooling body 304 may include a fourth cavity 430, configured for receiving a portion 432 of an additional metal cooling block 306. The fourth cavity 430 may have an opening 434 in the surface 415 of the metal cooling body 304, configured for receiving the portion 432 of the additional metal cooling block 306. The fourth cavity 430 may have a depth represented by an arrow 436 substantially traversing a width represented by an arrow 440 of the metal cooling body 304 except for a backstop region 442. The metal cooling body 304 may include another cavity (not shown) having an opening in the surface 413 of the metal cooling body 304. That another cavity may be configured for receiving a portion of another metal cooling block 306, and may be located adjacent to the fourth cavity 430 and having a depth 436 and substantially traversing the width 440 of the metal cooling body 304. That another cavity may also be oriented in a direction opposite to the direction of the arrow 436.

Alternatively, a metal cooling block 306 may be modified (not shown) to include a cavity, and the metal cooling body 304 may be modified (not shown) to include a metal projection extending away from a surface 413, 415 and configured for insertion of a portion of the metal projection into the cavity of the modified metal cooling block 306. It is understood that the apparatus 300 may have any selected quantities of additional cavities 402, 406, 420, 430 each configured for receiving a portion 404, 408, 422, 432 of a metal cooling block 306 and having orientations in the metal cooling body 304 analogous to those discussed above. In another example, a metal cooling block 306 may be modified to contain a heat pipe 443 for facilitating conduction of heat from an electronic component X through the metal cooling block 306 and into the metal cooling body 304. The heat pipe 443 is sealed inside the metal cooling block 306 to prevent leakage of a working fluid out of the metal cooling block 306.

The apparatus 300 may include joint materials 444 located between and in contact with the metal cooling body 304 and the metal cooling blocks 306. The joint materials 444 may be attached to or not attached to the metal cooling body 304, and may be attached to or not attached to a metal cooling block 306. Each of the joint materials 444 may include carbon fiber velvet, a compressible gasket, a clamp, a thin layer of a thermally-conductive paste or thermal grease, another suitable thermally-conductive material, or a combination including two or more of the foregoing.

Each of the metal cooling blocks 306 may have a first side 446, and a second side 448 opposite the first side 446. The internal passageway 308 defining part of the fluid pathway 314 may include first circuitous regions 450 located in the metal cooling body 304 and being in communication along directions represented by arrows 452 with and located adjacent to the first sides 446 of one or a plurality of the metal cooling blocks 306. The internal passageway 308 may also include second circuitous regions 454 located in the metal cooling body 304 and being in communication along directions represented by arrows 456 with and located adjacent to the second sides 448 of one or a plurality of the metal cooling blocks 306. Further, the internal passageway 309 defining part of the fluid pathway 315 may include first circuitous regions 458 located in the metal cooling body 304 and being in communication along directions represented by arrows 460 with and located adjacent to the first sides 446 of one or a plurality of the metal cooling blocks 306. Additionally, the internal passageway 309 may include second circuitous regions 462 located in the metal cooling body 304 and being in communication along directions represented by arrows 464 with and located adjacent to the second sides 448 of one or a plurality of the metal cooling blocks 306. In operation of the apparatus 300, heat flows away from the metal cooling blocks 306 in the directions of the arrows 452, 456, 460, 464. The circuitous regions 450, 454 of the internal passageway 308 and the circuitous regions 458, 462 of the internal passageway 309 may be arranged so that some of the circuitous regions 450, 454, 458, 462 of each of the internal passageways 308, 309 are located most closely adjacent to some of the cavities 402, 406, 420, 430. As an example, locating some of the circuitous regions 450, 454, 458, 462 of each of the internal passageways 308, 309 most closely adjacent to some of the cavities 402, 406, 420, 430 may enable the apparatus 300 to function despite inoperability of one of the fluid pathways 314, 315. The second cavity 406 may include a circuitous region 450 located between a circuitous region 458 and the first side 446 of a metal cooling block 306, and a circuitous region 462 located between a circuitous region 454 and the second side 448 of that metal cooling block 306.

Figure 5:
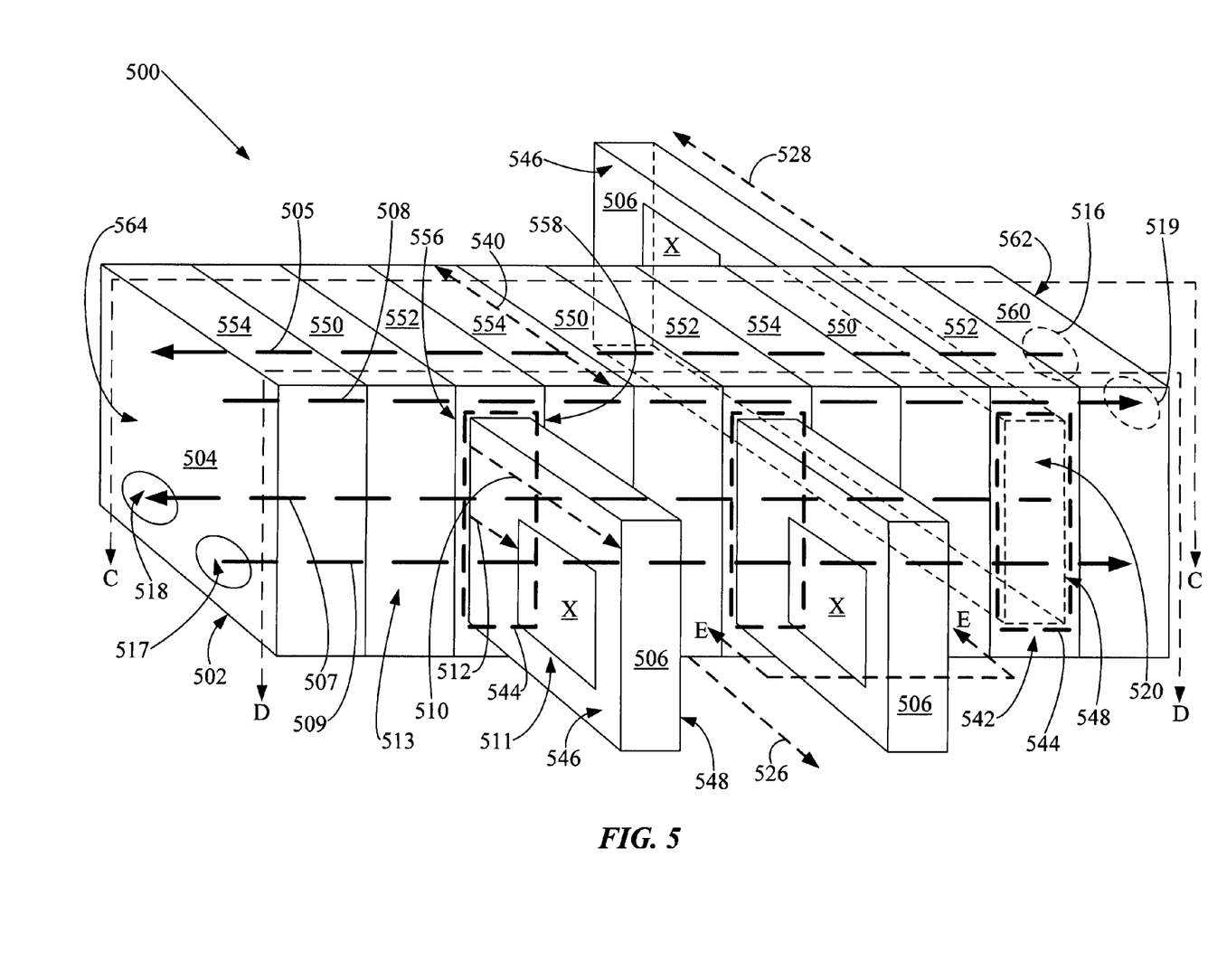
FIG. 5 is a perspective view showing an additional example of an apparatus.
Figure 6:
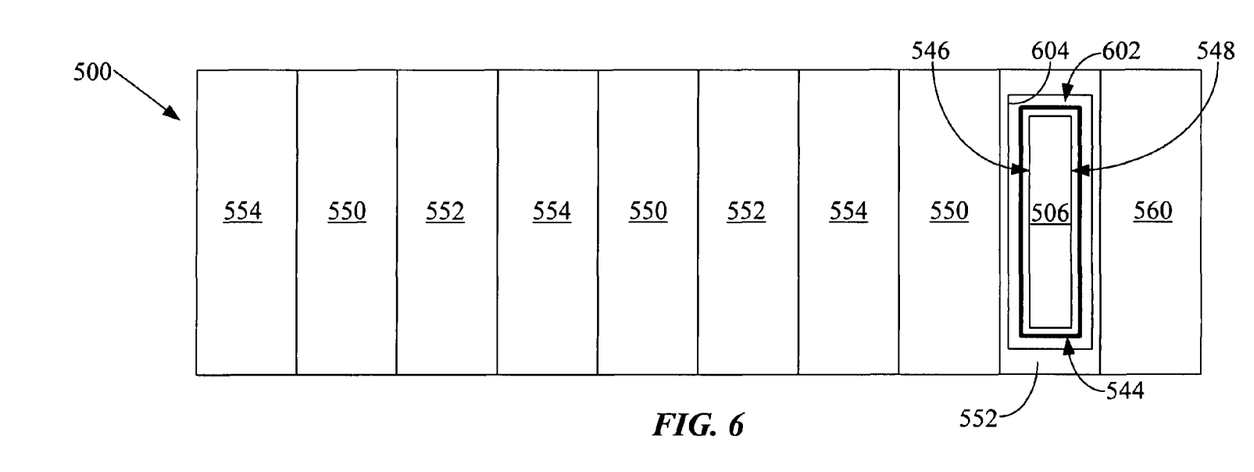
FIG. 6 is a cross-sectional view, taken along the line C-C, of the apparatus shown in FIG. 5.
Figure 7:
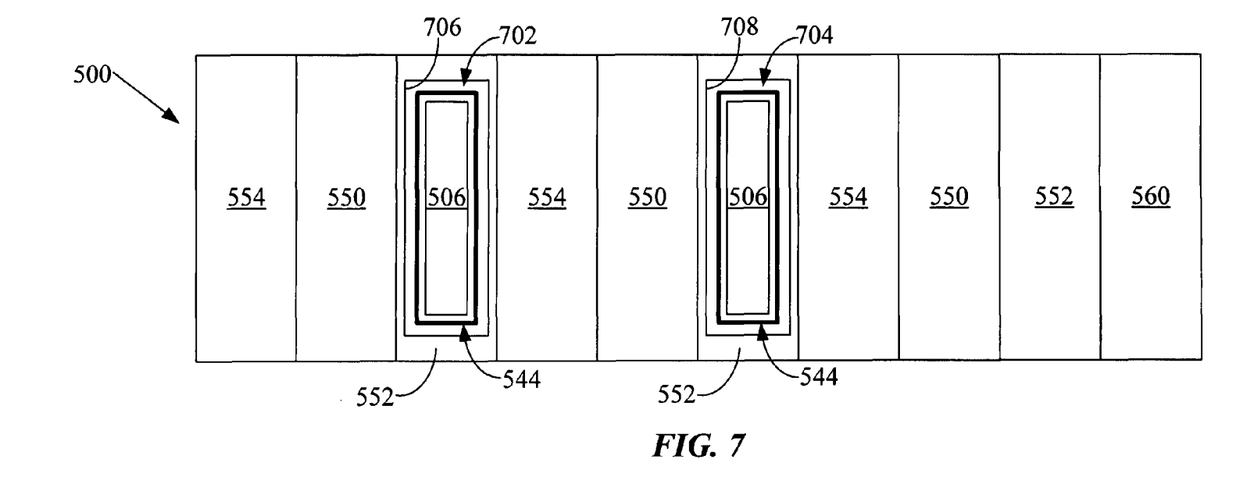
FIG. 7 is another cross-sectional view, taken along the line D-D, of the apparatus shown in FIG. 5.

FIG. 5 is a perspective view showing an additional example of an apparatus 500. FIG. 6 is a cross-sectional view, taken along the line C-C, of the apparatus 500 shown in FIG. 5. FIG. 7 is another cross-sectional view, taken along the line D-D, of the apparatus 500 shown in FIG. 5. The apparatus 500 includes a cooling manifold 502. The cooling manifold 502 has a metal cooling body 504 and one or a plurality of metal cooling blocks 506. The metal cooling body 504 has one or a plurality of internal passageways aligned in directions schematically represented by arrows 505, 507, 508, 509. A metal cooling block 506 extends along a direction represented by an arrow 510 away from the metal cooling body 504. The direction 510 is transverse to the directions 505, 507, 508, 509. The direction 510 may be perpendicular to the directions 505, 507, 508, 509. The metal cooling block 506 has a surface 511 oriented for being placed adjacent to and in substantially direct thermal communication with an electronic component X located at a distance represented by an arrow 512 away from the metal cooling body 504. A joint material such as a thin layer of a thermally-conductive paste or grease, or another suitable thermally-conductive material (not shown) may fill any narrow layer-like region between an electronic component X and the metal cooling block 506. The cooling manifold 502 is configured for circulating a working fluid (not shown) on one or a plurality of fluid pathways (not shown) that include the internal passageways 505, 507, 508, 509. The internal passageways 505, 507, 508, 509 may approach near the one or plurality of metal cooling blocks 506. The internal passageways 505, 507, 508, 509 preclude passage of the working fluid from the metal cooling body 504 into a metal cooling block 506. The internal passageways 505, 507, 508, 509 may keep the working fluid away from the electronic components X, serving to also prevent any working fluid that may escape from the metal cooling body 504 from making contact with and damaging the electronic components X.

The apparatus 500 may be configured for circulating a working fluid through a plurality of the internal passageways 505, 507 in a first general direction, and for circulating a working fluid through another plurality of the internal passageways 508, 509 in a second, different general direction. The internal passageways 505, 507 may together form part of a first fluid pathway, and the internal passageways 508, 509 may together form part of a second fluid pathway. The first fluid pathway including the internal passageways 505, 507 may be spaced apart and isolated from the second fluid pathway including the internal passageways 508, 509. As an example, including the internal passageways 505, 507, 508, 509 in the apparatus 500, forming parts of two separated, isolated first and second fluid pathways, may enable the apparatus 500 to function despite inoperability of one of the first and second fluid pathways. Hence, the apparatus 500 may be able to remove heat from electronic components X despite a failure of a cooling function of one of the first and second fluid pathways. The first general direction 505, 507 may be opposite to the second general direction 508, 509. The apparatus 500 may alternatively be configured for circulating a working fluid through a plurality of internal passageways 505, 507, 508, 509 all in generally a same direction. Each of the internal passageways 505, 507 in the metal cooling body 504 may be in fluid communication with an inlet port 516 and an outlet port 518; and each of the internal passageways 508, 509 may be in fluid communication with an inlet port 517 and an outlet port 519. Further, the cooling manifold 502 may be configured for confining the working fluid within each of the internal passageways 505, 507 between the inlet port 516 and the outlet port 518; and for confining the working fluid within each of the internal passageways 508, 509 between the inlet port 517 and the outlet port 519.

The cooling manifold 502 may be configured to facilitate detachment of a metal cooling block 506 from and reattachment of the metal cooling block 506 to the metal cooling body 504. Since the internal passageways 505, 507, 508, 509 preclude passage of the working fluid from the metal cooling body 504 into a metal cooling block 506, such detachment and reattachment may be carried out without a potential escape of the working fluid leading to possible damage of the electronic components X.

The metal cooling body 504 may include a first cavity 602 configured for receiving a portion 520 of a metal cooling block 506. The metal cooling body 504 may further include second and third cavities 702, 704, each configured for receiving a portion (not shown) of another metal cooling block 506. The first, second and third cavities 602, 702, 704 may respectively have first, second and third cavity walls 604, 706, 708, with portions of first, second and third metal cooling blocks 506 being in the cavities 602, 702, 704 and being in thermal communication with portions of the cavity walls 604, 706, 708. The portions of the first, second and third metal cooling blocks 506 may be in substantially direct thermal communication with portions of the cavity walls 604, 706, 708.

The second and third cavities 702, 704 may each have an opening (not shown) in a surface 513 of the metal cooling body 504. The openings (not shown) of the second and third cavities 702, 704 may both face away from the metal cooling body 504 in a first direction represented by an arrow 526. The opening (not shown) of the first cavity 602 may face away from the metal cooling body 504 in a second direction represented by an arrow 528. The opening (not shown) of the first cavity 602 may face in a direction 528 generally opposite to a direction 526 toward which the cavities 702, 704 may face.

The first cavity 602 may have a depth substantially traversing a width of the metal cooling body 504 in a direction represented by an arrow 540, except for a backstop region 542. It is understood that the apparatus 500 may have any selected quantities of additional cavities each configured for receiving a portion 520 of a metal cooling block 506 and having orientations in the metal cooling body 504 analogous to those discussed above. The apparatus 500 may include joint materials 544 located between and in contact with the metal cooling body 504 and the metal cooling blocks 506. The joint materials 544 may be attached to or not attached to the metal cooling body 504, and may be attached to or not attached to a metal cooling block 506. Each of the joint materials 544 may include carbon fiber velvet, a compressible gasket, a clamp, a thin layer of a thermally-conductive paste or grease, another suitable thermally-conductive material, or a combination including two or more of the foregoing. Each of the metal cooling blocks 506 may have a first side 546, and a second side 548 opposite the first side 546.

Figure 8:
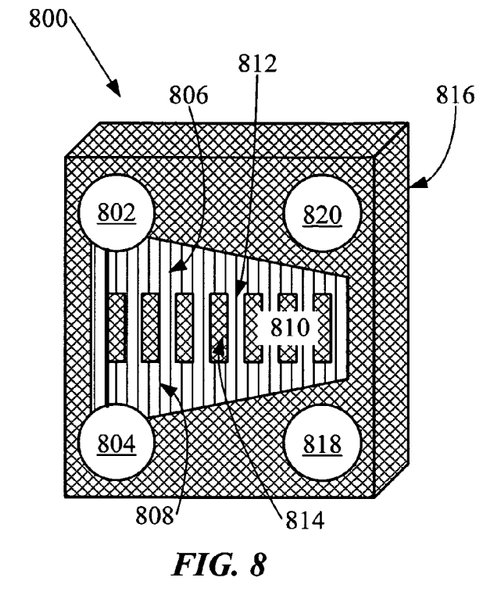
FIG. 8 is a perspective view showing an example of a fluid distribution plate that may be included in the apparatus shown in FIG. 5.

The metal cooling body 504 may include a plurality of fluid distribution plates 550. FIG. 8 is a perspective view showing an example 800 of a fluid distribution plate 550 that may be included in the apparatus 500 shown in FIG. 5. Each of the plurality of fluid distribution plates 550, 800 may have a first fluid input aperture 802 and a first fluid output aperture 804. Further, each of the plurality of fluid distribution plates 550, 800 may have a first fluid collection region 806 and a second fluid collection region 808. The first and second fluid collection regions 806, 808 may be spaced apart by and in communication through a circuitous flow region 810. The circuitous flow region 810 may include a plurality of flow passages 812 spaced apart by a plurality of interposed raised ribs 814. The circuitous flow region 810 may alternatively include a serpentine path (not shown) with one or more "S"-shaped path regions. Additionally, the first fluid collection region 806 may communicate with the first fluid input aperture 802, and the second fluid collection region 808 may communicate with the first fluid output aperture 804.

Figure 9:
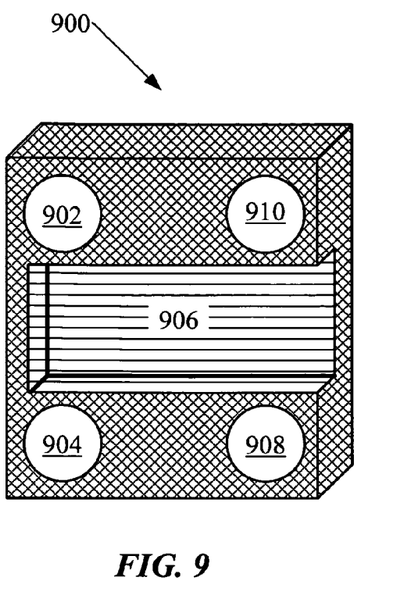
FIG. 9 is a perspective view showing an example of a metal cooling body cavity plate that may be included in the apparatus shown in FIG. 5.

The metal cooling body 504 may include a plurality of metal cooling body cavity plates 552. FIG. 9 is a perspective view showing an example 900 of a metal cooling body cavity plate 552 that may be included in the apparatus 500 shown in FIG. 5. Each metal cooling body cavity plate 552, 900 may have a fluid input aperture 902 and a fluid output aperture 904. Further, each metal cooling body cavity plate 552, 900 may include a cavity 906 spaced apart from the fluid input aperture 902 and from the fluid output aperture 904. The apparatus 500 may include a plurality of fluid distribution plates 550, 800 and a plurality of metal cooling body cavity plates 552, 900 assembled together. Further, each of the cavities 602, 702, 704 may be a cavity 906 of a metal cooling body cavity plate 552, 900. Also, the fluid input apertures 802, 902 may collectively define a portion of the internal passageway 505; and the fluid output apertures 804, 904 may collectively define a portion of the internal passageway 507. A cavity 602, 702, 704 may alternatively be integrally formed (not shown) in a back surface 816 of each of the fluid distribution plates 550, 800.

Figure 10:
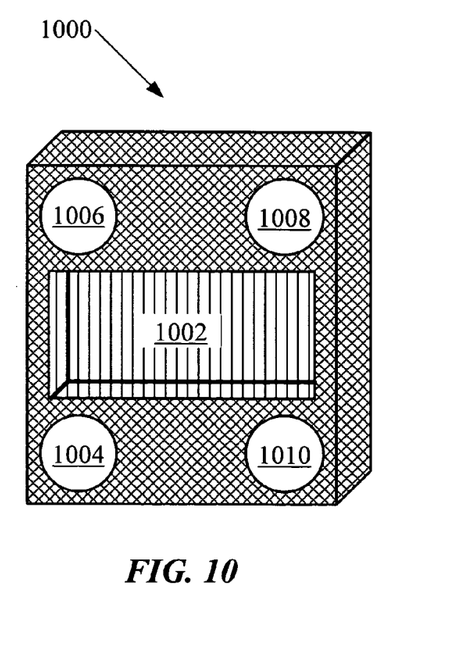
FIG. 10 is a perspective view showing an example of a fluid reservoir plate that may be included in the apparatus shown in FIG. 5.

The metal cooling body 504 may include a plurality of plate pairs each including a fluid distribution plate 550, 800 and a fluid reservoir plate 554. Each of the plurality of plate pairs may form a portion of an internal passageway 505, 507, 508, 509. FIG. 10 is a perspective view showing an example 1000 of a fluid reservoir plate 554 that may be included in the apparatus 500 shown in FIG. 5. Each of a plurality of fluid reservoir plates 554, 1000 may have a fluid reservoir region 1002. Further, each of a plurality of fluid reservoir plates 554, 1000 may include a second fluid input aperture 1004 and a second fluid output aperture 1006 both being spaced apart from the fluid reservoir region 1002. The circuitous flow region 810 of the fluid distribution plate 550, 800 and the fluid reservoir region 1002 of the fluid reservoir plate 554, 1000 in each plate pair may face each other. Accordingly, the circuitous flow region 810 and the fluid reservoir region 1002 in each plate pair may together form a chamber having first and second fluid input apertures 802, 1004; and having first and second fluid output apertures 804, 1006. Further, the first and second fluid input apertures 802, 1004 of each plate pair may cooperate together to form a portion of the internal passageway 505. Likewise, the first and second fluid output apertures 804, 1006 of each plate pair may cooperate together to form a portion of the internal passageway 507. The metal cooling body 504 may also include a plurality of metal cooling body cavity plates 552, 900. An apparatus 500 may include a plurality of fluid distribution plates 550, 800, a plurality of metal cooling body cavity plates 552, 900, and a plurality of fluid reservoir plates 554, 1000 assembled together. The fluid input apertures 802, 902, 1004 may collectively define a portion of the internal passageway 505; and the fluid output apertures 804, 904, 1006 may collectively define a portion of the internal passageway 507.

Each of the plurality of fluid distribution plates 550, 800 may include a third fluid input aperture 818 and a third fluid output aperture 820 both being spaced apart from the fluid collection regions 806, 808 and from the circuitous flow region 810. Each of the plurality of metal cooling body cavity plates 552, 900 may include a third fluid input aperture 908 and a third fluid output aperture 910 both being spaced apart from the cavity 906. Each of the plurality of fluid reservoir plates 554, 1000 may include a third fluid input aperture 1008 and a third fluid output aperture 1010 both being spaced apart from the fluid reservoir region 1002. The third fluid input apertures 818, 908, 1008 may cooperate together to form a portion of the internal passageway 509, and the third fluid output apertures 820, 910, 1010 may cooperate together to form a portion of the internal passageway 508.

The internal passageways 505, 507 may together form part of a first fluid pathway (not shown), and the internal passageways 508, 509 may together form part of a second fluid pathway (not shown). Further, the first fluid pathway may enter the metal cooling body 504 at the inlet port 516 and exit the metal cooling body 504 at the outlet port 518; and the second fluid pathway may enter the metal cooling body 504 at the inlet port 517 and exit the metal cooling body 504 at the outlet port 519.

A plurality of the metal cooling body cavity plates 552, 900 may be rotated by 180 degrees so that a plurality of the first, second and third input apertures 802, 1004, 908 are aligned together to form a portion of the internal passageway 505. A first plate pair including a fluid distribution plate 550, 800 and a fluid reservoir plate 554, 1000 may be located adjacent to a first side 556 of a metal cooling body cavity plate 552, 900;

and a second plate pair including a fluid distribution plate 550, 800 and a fluid reservoir plate 554, 1000 may be located adjacent to a second side 558 of the metal cooling body cavity plate 552, 900. The circuitous flow region 810 of the fluid distribution plate 550, 800 in the first plate pair may be in fluid communication through a fluid input aperture 802 forming part of the internal passageway 505, and in fluid communication through a fluid output aperture 804 forming part of the internal passageway 507. Additionally, the circuitous flow region 810 of the fluid distribution plate 550, 800 in the second plate pair may be in fluid communication through a fluid input aperture 802 forming part of the internal passageway 509, and in fluid communication through a fluid output aperture 804 forming part of the internal passageway 508.

Figure 11:
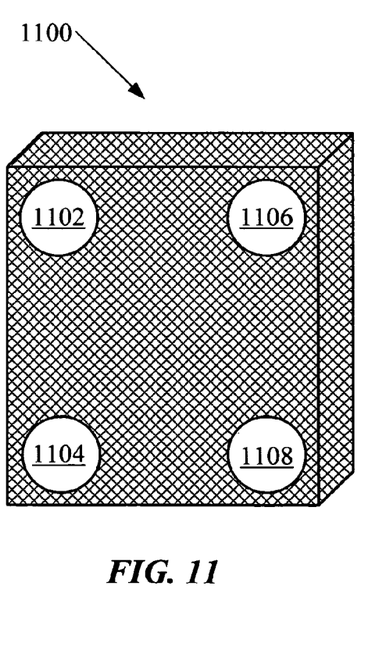
FIG. 11 is a perspective view showing an example of an end plate that may be included in the apparatus shown in FIG. 5.

The apparatus 500 may include an end plate 560 at an end 562 of the metal cooling body 504. FIG. 11 is a perspective view showing an example 1100 of an end plate 560 that may be included in the apparatus 500 shown in FIG. 5. The end plate 560, 1100 may include four fluid apertures 1102, 1104, 1106, 1108. The fluid apertures 1102, 1104, 1106, 1108 may respectively be in alignment with and form parts of the internal passageways 505, 507, 508 and 509. The apparatus 500 may include another end plate 560, 1100 at another end 564 of the metal cooling body 504. It is understood that the locations and quantities of fluid input and output apertures included in the apparatus 500 may be varied. For example, the apertures 818, 820, 908, 910, 1008, 1010, 1106, 1108 may be omitted.

Figure 12:
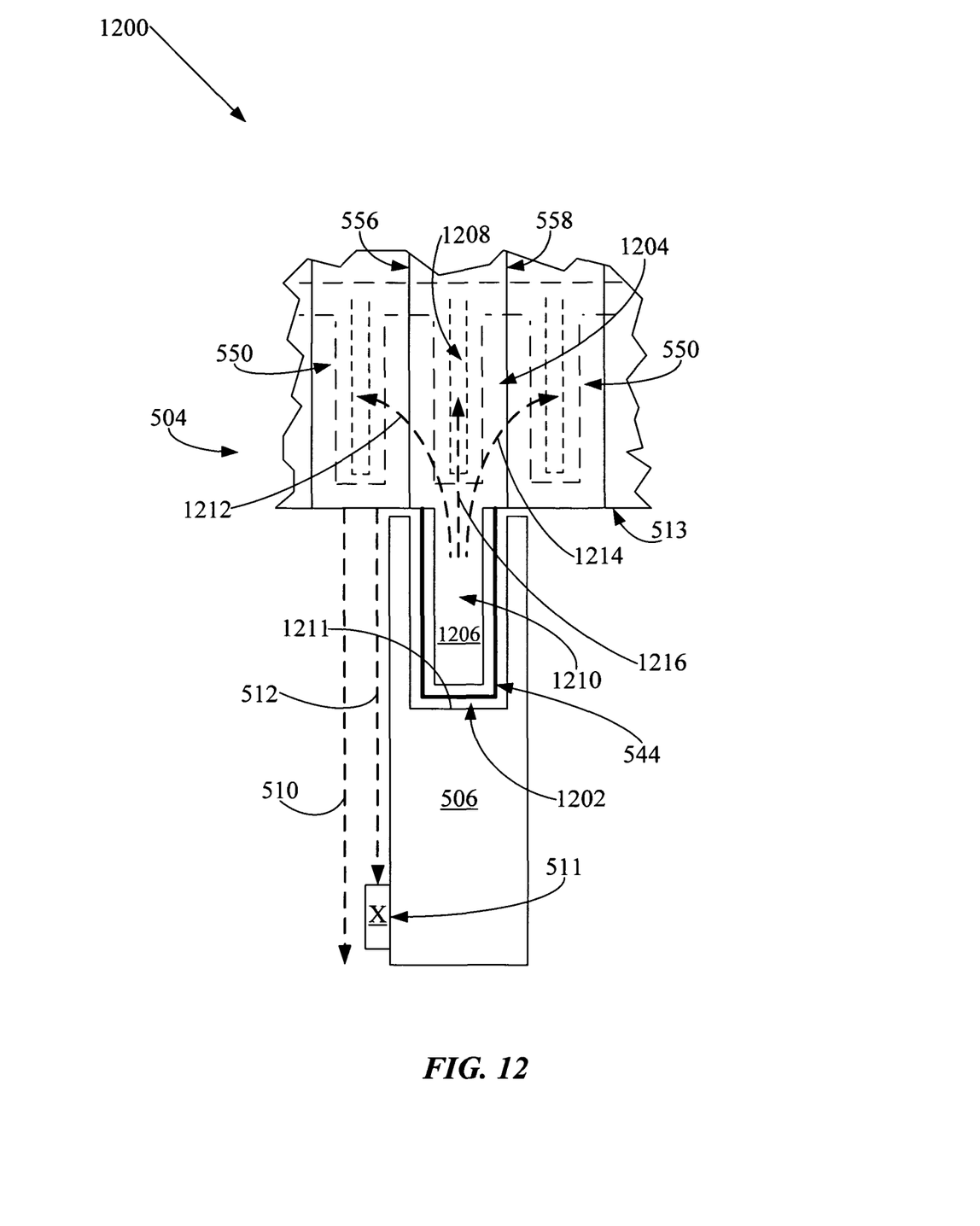
FIG. 12 is a partial cross-sectional view, taken along the line E-E, of an example of a modification of the apparatus shown in FIG. 5.

FIG. 12 is a partial cross-sectional view, taken along the line E-E, of an example 1200 of a modification of the apparatus 500 shown in FIG. 5. As shown in FIG. 12, a metal cooling block 506 may be modified to include a cavity 1202. Further, a metal cooling body cavity plate 552 of the apparatus 500 may be replaced by a fluid distribution plate 1204 having a metal projection 1206 extending away from the surface 513 of the metal cooling body 504. The fluid distribution plate 1204 may include (not shown) a fluid input aperture, a fluid output aperture, and first and second fluid collection regions spaced apart by and in communication through a circuitous flow region 1208, and further apertures as discussed in connection with FIG. 8. The cavity 1202 may be configured so that a portion 1210 of the metal projection 1206 may be inserted into the cavity 1202. The cavity 1202 may have a cavity wall 1211, a portion of the metal projection 1206 being in the cavity 1202 and being in thermal communication with a portion of the cavity wall 1211. The portion of the metal projection 1206 may be in substantially direct thermal communication with a portion of the cavity wall 1211. The apparatus 1200 may include a joint material 544 located between and in contact with the metal cooling block 506 and with the metal projection 1206 of the metal cooling body 504. A first plate pair including a first fluid distribution plate 550 and a first fluid reservoir plate (not shown) may be located adjacent to a first side 556 of the fluid distribution plate 1204; and a second plate pair including a second fluid distribution plate 550 and a second fluid reservoir plate (not shown) may be located adjacent to a second side 558 of the fluid distribution plate 1204. The metal cooling block 506 extends in a direction represented by an arrow 510 away from the metal cooling body 504. The metal cooling block 506 has a surface 511 oriented for being placed adjacent to and in substantially direct thermal communication with an electronic component X located at a distance represented by an arrow 512 away from the surface 513 of the metal cooling body 504. The apparatus 1200 may be configured for removing heat from an electronic component X through the metal cooling block 506, across the joint material 544, through the metal projection 1206 and into the first and second distribution plates 550 in general directions represented by arrows 1212, 1214, respectively. Likewise, the apparatus 1200 may be configured for removing heat from an electronic component X through the metal cooling block 506, across the joint material 544, through the metal projection 1206 and into the distribution plate 1204 in a general direction represented by arrow 1216. The internal passageways 505, 507, 508, 509 do not enter the metal cooling block 506. The cooling manifold 502 is configured for circulating a working fluid (not shown) through one or a plurality of fluid pathways (not shown) that include the internal passageways 505, 507, 508, 509 and for precluding passage of the working fluid from the metal projection 1206 of the metal cooling body 504 into the metal cooling block 506. In an example (not shown), an internal passageway 505, 507, 508, 509 may enter a metal projection 1206. In that example, the internal passageway 505, 507, 508, 509 precludes flow of the working fluid out from the metal projection 1206 into the cavity 1202, thereby precluding passage of the working fluid from the metal cooling body 504 into the metal cooling block 506. The internal passageways 505, 507, 508, 509 may keep the working fluid away from the electronic components X, serving to also prevent any working fluid that may escape from the metal cooling body 504 from making contact with and damaging the electronic components X.

A metal cooling block 106, 306 of an apparatus 100, 300 may be modified (not shown) to include a cavity 1202 in a manner analogous to these modifications of the metal cooling block 506 discussed in connection with FIG. 12. Also (not shown), a metal cooling body 104, 304 of an apparatus 100, 300 may be modified to include a metal projection 1206 in a manner analogous to the modifications of the metal cooling body 504 discussed in connection with FIG. 12. An apparatus 100, 300, 500, 1200 may include a plurality of metal projections 1206 and a plurality of metal cooling blocks 106, 306, 506 each including a cavity 1202. An apparatus 100, 300, 500, 1200 may include one or a plurality of metal cooling blocks 106, 306, 506 as discussed above in connection with FIGS. 1-11, and one or a plurality of metal cooling blocks 106, 306, 506 each being modified as discussed in connection with FIG. 12 and including a cavity 1202, and one or a plurality of metal projections 1206. Each of these apparatus 100, 300, 500, 1200 is configured for circulating a working fluid (not shown) through one or a plurality of internal passageways 108, 308, 309, 505, 507, 508, 509 and for precluding passage of the working fluid from the metal cooling body 104, 304, 504 into a metal cooling block 106, 306, 506.

The metal cooling bodies 104, 304, 504, metal cooling blocks 106, 306, 506, and metal projections 1206 may be fabricated from a metal element or alloy having thermal conductivity suitable for transfer of heat from an electronic component X to a working fluid. A metal cooling block 106, 306, 506 may be solid as shown in FIGS. 1-7 and 12, or may contain an internal structure for facilitating conduction of heat from an electronic component X through the metal cooling block 106, 306, 506 and into the metal cooling body 104, 304, 504. For example, a metal cooling block 106, 306, 506 may contain a heat pipe 443 for facilitating such conduction of heat from an electronic component X, the heat pipe being sealed inside the metal cooling block 106, 306, 506 to prevent leakage of a working fluid out of the metal cooling block 106, 306, 506.

The metal cooling bodies 104, 304, 504, metal cooling blocks 106, 306, 506, and metal projections 1206 of the apparatus 100, 300, 500, 1200 may have overall shapes and geometries suitable for a particular end-use application. The metal cooling body 104, 304, 504 may have a rectangular rhomboid shape, a cylindrical shape, or another regular or non-uniform shape. Each of the one or plurality of metal cooling blocks 106, 306, 506 and metal projections 1206 may likewise have a rectangular rhomboid shape, a cylindrical shape, or another regular or non-uniform shape.

Figure 13:
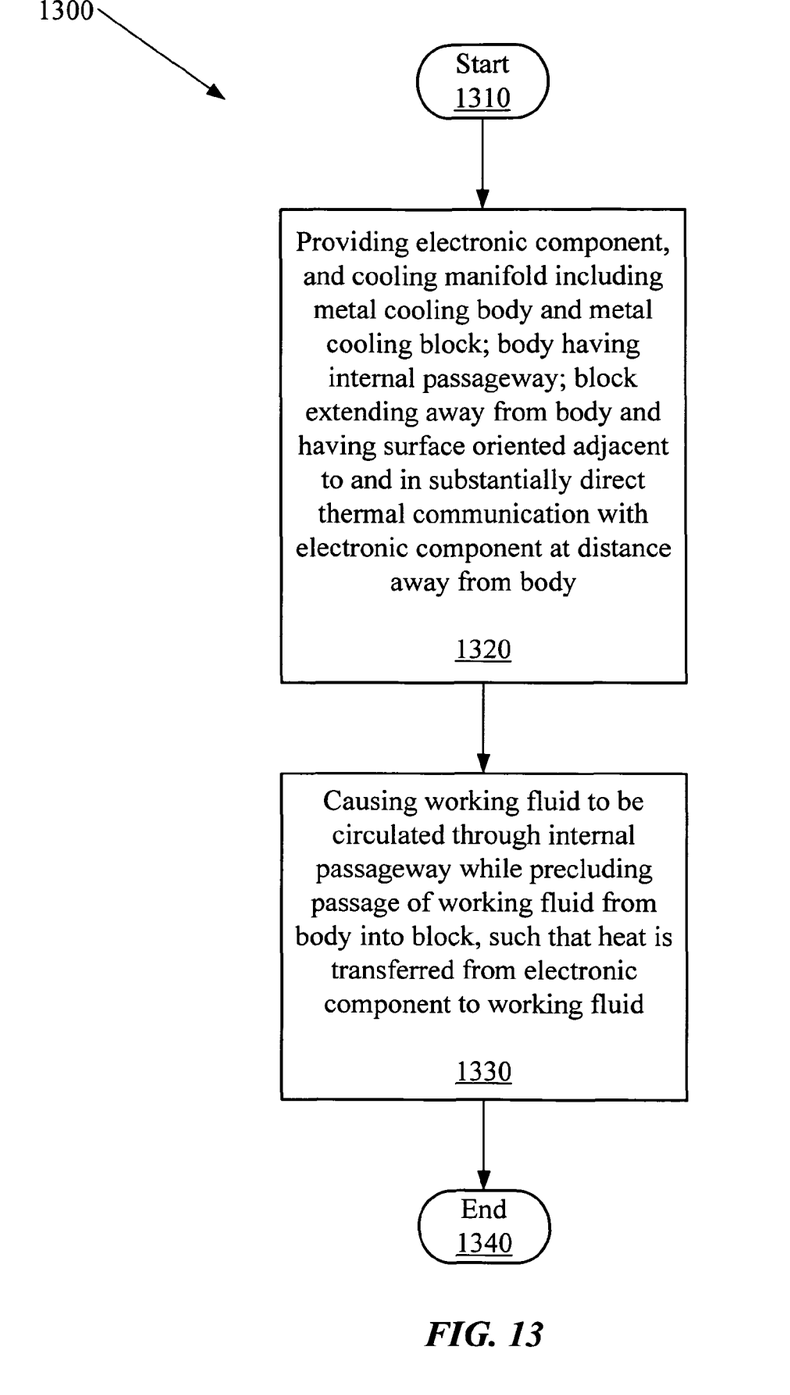
FIG. 13 is a flow chart showing an example of an implementation of a method.

FIG. 13 is a flow chart showing an example of an implementation of a method 1300. The method 1300 may be utilized with, for example, an apparatus 100, 300, 500, 1200. The method starts at step 1310, and then step 1320 includes providing an electronic component X and a cooling manifold 102, 302, 502. The cooling manifold 102, 302, 502 includes a metal cooling body 104, 304, 504 having one or a plurality of internal passageways 108, 308, 309, 505, 507, 508, 509. The cooling manifold 102, 302, 502 also includes one or a plurality of metal cooling blocks 106, 306, 506 extending away from the metal cooling body 104, 304, 504. A surface 111, 320, 511 of a metal cooling block 106, 306, 506 is oriented adjacent to and in substantially direct thermal communication with the electronic component X, being located at a distance 112, 312, 512 away from the metal cooling body 104, 304, 504. The cooling manifold 102, 302, 502 may include any of the various features discussed herein in connection with FIGS. 1-12.

Step 1330 includes causing a working fluid (not shown) to be circulated through one or a plurality of internal passageways 108, 308, 309, 505, 507, 508, 509 while precluding passage of the working fluid from the metal cooling body 104, 304, 504 into the one or plurality of metal cooling blocks 106, 306, 506, such that heat is transferred from the electronic component X to the working fluid, in directions of arrows 252, 256, 452, 456, 460, 464. The method 1300 may then end at step 1340.

Step 1330 may include causing a working fluid to be circulated through one or a plurality of internal passageways 308, 505, 507 in a first general direction 314, and for circulating a working fluid through another one or plurality of internal passageways 309, 508, 509 in a second, different general direction 315. The first general direction 314 may be opposite to the second general direction 315. Step 1330 may alternatively include causing a working fluid to be circulated through a plurality of internal passageways 308, 309, 505, 507, 508, 509 all in generally a same direction. Step 1330 may include confining the working fluid within the internal passageways 108, 308, 309, 505, 507, 508, 509 between the inlet ports 116, 316, 317, 516, 517 and the outlet ports 118, 318, 319, 518, 519. Step 1330 may include causing a working fluid to be circulated through a portion of an internal passageway 505 or 509 collectively defined by fluid input apertures 802, 902, 1004, and that includes a portion of an internal passageway 507 or 508 collectively defined by the fluid output apertures 804, 904, 1006.

Step 1330 may include causing a working fluid to be circulated through a first fluid pathway (not shown) including internal passageways 505, 507, and may include causing a working fluid to be circulated through a second fluid pathway (not shown) including internal passageways 509, 508. Step 1330 may include causing a working fluid to enter the metal cooling body 504 at the inlet port 516, pass through the internal passageway 505 to the internal passageway 507 and then exit the metal cooling body 504 at the outlet port 518. Further, step 1330 may include causing a working fluid to enter the metal cooling body 504 at the inlet port 517, pass through the internal passageway 509 to the internal passageway 508 and then exit the metal cooling body 504 at the outlet port 519.

The apparatus 100, 300, 500, 1200 may be utilized as a cooling manifold for removing heat from an electronic component X. The term "electronic component" X means a device including electrical conductors affecting the device in operation. The term "electronic component" X includes, as examples: semiconductor devices including transistors, diodes, resistors and capacitors; filters; sensors; microprocessors; switches; transformers; transmitters; receivers; microfluidic devices; and optoelectronic devices including micro-electro-mechanical systems ("MEMS"). The term "MEMS" means a device that integrates mechanical elements, actuators for the mechanical elements, and electronics for controlling the actuators. Electronic components X may be mounted on a printed circuit board. An apparatus 100, 300, 500, 1200 may be configured for removing heat from an array of printed circuit boards each containing one or a plurality of electronic components X. An apparatus 100, 300, 500, 1200 may include a plurality of metal cooling blocks 106, 306, 506 each positioned to be placed in communication with an electronic component X on one among an array of printed circuit boards. The apparatus 100, 300, 500, 1200 may be utilized for cooling electronic components X mounted on an array of printed circuit boards in an Advanced TCA modular shelf communication system. The apparatus 100, 300, 500, 1200 may be mounted in Zone 3 of an Advanced TCA system. The method 1300 may be implemented in analogous manners for cooling one or a plurality of electronic components X. A working fluid for utilization in the apparatus 100, 300, 500, 1200 and with the method 1300 may include, as examples, water, ethylene glycol, propylene glycol, a fluorinated hydrocarbon, helium, ammonia, a cryogenic fluid, or a combination including two or more of the foregoing. The working fluid may be in a liquid state, a gaseous state, or in both liquid and gaseous states at an operating temperature of the apparatus 100, 300, 500, 1200 or method 1300. The working fluid may have a higher specific heat than ambient air. The working fluid utilized in the apparatus 100, 300, 500, 1200 and with the method 1300 may be circulated on a fluid pathway 114, 314, 315 through a cooling plant (not shown) including an external chiller (not shown) suitable for cooling the working fluid in preparation for its recirculation through the apparatus 100, 300, 500, 1200. In a further example, the working fluid may be cooled in preparation for its recirculation through the apparatus 100, 300, 500, 1200 utilizing a system (not shown) including a micro-channel heat exchanger. Examples of a system having a micro-channel heat exchanger that may be suitable for so cooling the working fluid are disclosed in U.S. patent application Ser. No. 12/011,402, filed on Jan. 25, 2008, entitled "Modular In-Frame Pumped Refrigerant Distribution and Heat Removal System", the entirety of which is hereby incorporated herein by reference.

It is understood that the discussions of each of the apparatus 100, 300, 500, 1200 illustrate suitable variations of all of the apparatus 100, 300, 500, 1200 and of the method 1300. Likewise, it is understood that the discussion of the method 1300 illustrates suitable variations of each of the apparatus 100, 300, 500, 1200. Accordingly, the entire discussion of the apparatus 100 is deemed incorporated into the discussions of the apparatus 300, 500, 1200 and of the method 1300. Likewise, the entire discussion of the apparatus 300 is deemed incorporated into the discussions of the apparatus 100, 500, 1200 and of the method 1300. Further, the entire discussion of the apparatus 500 is deemed incorporated into the discussions of the apparatus 100, 300, 1200 and of the method 1300. In addition, the entire discussion of the method 1300 is deemed incorporated into the discussions of the apparatus 100, 300, 500, 1200.

Moreover, it will be understood that the foregoing description of numerous examples has been presented for purposes of illustration and description. This description is not exhaustive and does not limit the claimed invention to the precise forms disclosed. Modifications and variations are possible in light of the above description or may be acquired from practicing the invention. The claims and their equivalents define the scope of the invention.

What is claimed is:

1. An apparatus, comprising a: cooling manifold, including a metal cooling body having a cavity and having an internal passageway that has a circuitous region adjacent to a portion of a wall of the cavity, and including a metal cooling block configured for being positioned with a portion of the metal cooling block in substantially direct thermal communication with the portion of the wall that is adjacent to the circuitious region while another portion of the metal cooling block is extending outside of the metal cooling body, the another portion of the metal cooling block having a surface oriented for being placed adjacent to and in substantially direct thermal communication with an electronic component located at a distance away from the metal cooling body;
wherein the metal cooling body including a plurality of fluid distribution plates; and wherein each of the plurality of fluid distribution plates has a first fluid input aperture, a first fluid output aperture, first and second spaced apart fluid collection regions communication through a circuitous flow region, the first fluid collection region communication with the first fluid input aperture, and the second fluid collection region communication with the first fluid output aperture; and wherein the circuitous flow region of one of the fluid distribution plates forms the circuitous region adjacent to the portion of the wall of the cavity;
wherein the metal cooling body includes a physical series of plate pairs, each of the series of plate pairs having a one of the plurality of fluid distribution plates and a one of a plurality of fluid reservoir plates, wherein each of the plurality of fluid reservoir plates has a fluid reservoir region, and wherein each of the series of plate pairs forms a portion of the internal passageway; and
wherein the cooling manifold is configured for circulating a working fluid through the internal passageway and for precluding passage of the working fluid from the metal cooling body into the metal cooling block.

2. The apparatus of claim 1, wherein each of the plurality of fluid reservoir plates includes a second fluid input aperture and a second fluid output aperture both being spaced apart from the fluid reservoir region, wherein the first and second fluid input apertures of each of the series of plate pairs cooperate together to form another portion of the internal passageway, and wherein the first and second fluid output apertures of each of the series of plate pairs cooperate together to form a further portion of the internal passageway.

3. The apparatus of claim 2, wherein each of the plurality of fluid distribution plates includes a third fluid input aperture and a third fluid output aperture both being spaced apart from the fluid collection regions and from the circuitous flow region, wherein a plurality of the third fluid input apertures cooperate together with the first and second fluid input apertures to form the another portion of the internal passageway, and wherein a plurality of the third fluid output apertures cooperate together with the first and second fluid output apertures to form the further portion of the internal passageway.

4. The apparatus claim 1 including an electronic component, the surface of the metal cooling block being oriented adjacent to and in substantially direct thermal communication with the electronic component.

5. The apparatus of claim 1 wherein the cooling manifold facilitates detachment of the metal cooling block from the metal cooling body.

6. The apparatus of claim 1 further including another metal cooling block, wherein the metal cooling body includes another cavity having another wall, and wherein the another metal cooling block is configured for being positioned with a portion of the another metal cooling block in substantially direct thermal communication with a portion of the another wall of the another cavity.

7. The apparatus of claim 6, wherein an opening of the cavity faces away from the metal cooling body in a first direction, and wherein an opening of the another cavity faces away from the metal cooling body in a second direction different than the first direction.

8. An apparatus, comprising a: cooling manifold, including a metal cooling body having a cavity and having an internal passageway that has a circuitous region adjacent to a portion of a wall of the cavity, and including a metal cooling block configured for being positioned with a portion of the metal cooling block in substantially direct thermal communication with the portion of the wall that is adjacent to the circuitous region while another portion of the metal cooling block is extending outside of the metal cooling body, the another portion of the metal cooling block having a surface oriented for being placed adjacent to and in substantially direct thermal communication with an electronic component located at a distance away from the metal cooling body;
wherein the metal cooling body including a plurality of fluid distribution plates; and wherein each of the plurality of fluid distribution plates has a first fluid input aperture, a first fluid output aperture, first and second spaced apart fluid collection regions in communication through a circuitous flow region, the first fluid collection region communication with the first fluid input aperture, and the second fluid collection region communication with the first fluid output aperture; and wherein the circuitous flow region of one of the fluid distribution plates forms the circuitous region adjacent to the portion of the wall of the cavity;
wherein the metal cooling body has another cavity and includes a physical series of plate pairs, each of the series of plate pairs having a one of the plurality of fluid distribution plates and a one of a plurality of cavity plates, a one of the cavity plates forming the cavity and another one of the cavity plates forming the another cavity.

9. The apparatus of claim 1, wherein the metal cooling body has another cavity, and wherein each of the series of plate pairs is physically adjacent to a one of a plurality of cavity plates, a one of the cavity plates forming the cavity and another one of the cavity plates forming the another cavity.

10. The apparatus of claim 8, wherein each of the plurality of fluid distribution plates includes a third fluid input aperture and a third fluid output aperture both being spaced apart from the fluid collection regions and from the circuitous flow region, wherein a plurality of the third fluid input apertures cooperate together with the first and second fluid input apertures to form another portion of the internal passageway, and wherein a plurality of the third fluid output apertures cooperate together with the first and second fluid output apertures to form a further portion of the internal passageway.

11. The apparatus of claim 8 including an electronic component, the surface of the metal cooling block being oriented adjacent to and in substantially direct thermal communication with the electronic component.

12. The apparatus of claim 8, wherein the cooling manifold facilitates detachment of the metal cooling block from the metal cooling body.

13. The apparatus of claim 8, wherein an opening of the cavity faces away from the metal cooling body in a first direction, and wherein an opening of the another cavity faces away from the metal cooling body in a second direction different than the first direction.

14. An apparatus, comprising:
- a cooling manifold, including a metal cooling body having an internal passageway, and including a plurality of metal cooling blocks;
- the metal cooling body including a plurality of cavities each having a cavity wall, and including a physical series of plate pairs, each of the cavities being interposed between and located physically adjacent to two of the series of plate pairs;
- each of the plate pairs forming a portion of the internal passageway, and including a fluid reservoir plate having a fluid reservoir region, and including a fluid distribution plate having a circuitous flow region adjacent to a portion of one of the cavity walls;
- each of the fluid distribution plates having a first fluid input aperture, a first fluid output aperture, and first and second spaced apart fluid collection regions in communication through the circuitous flow region, the first fluid collection region communicating with the first fluid input aperture, and the second fluid collection region communicating with the first fluid output aperture;
- wherein each of the metal cooling blocks is configured for being positioned with a portion of the metal cooling block in substantially direct thermal communication with the portion of one of the cavity walls that is adjacent to one of the circuitous flow regions while another portion of the metal cooling block is extending outside of the metal cooling body, the another portion of the metal cooling block having a surface oriented for being placed adjacent to and in substantially direct thermal communication with an electronic component located at a distance away from the metal cooling body;
- wherein the cooling manifold is configured for circulating a working fluid through the internal passageway and for precluding passage of the working fluid from the metal cooling body into the metal cooling blocks.

15. The apparatus of claim 14, wherein each of the fluid reservoir plates includes a second fluid input aperture and a second fluid output aperture both being spaced apart from the fluid reservoir region, wherein the first and second fluid input apertures of each of the series of plate pairs cooperate together to form another portion of the internal passageway, and wherein the first and second fluid output apertures of each of the series of plate pairs cooperate together to form a further portion of the internal passageway.

16. The apparatus of claim 15, wherein each of the plurality of fluid distribution plates includes a third fluid input aperture and a third fluid output aperture both being spaced apart from the fluid collection regions and from the circuitous flow region, wherein a plurality of the third fluid input apertures cooperate together with the first and second fluid input apertures to form the another portion of the internal passageway, and wherein a plurality of the third fluid output apertures cooperate together with the first and second fluid output apertures to form the further portion of the internal passageway.

17. The apparatus of claim 14 including an electronic component, the surface of a one of the metal cooling blocks being oriented adjacent to and in substantially direct thermal communication with the electronic component.

18. The apparatus of claim 14, wherein the cooling manifold facilitates detachment of the metal cooling blocks from the metal cooling body.

19. The apparatus of claim 14, wherein an opening of a one of the cavities faces away from the metal cooling body in a first direction, and wherein an opening of another one of the cavities faces away from the metal cooling body in a second direction different than the first direction.

20. The apparatus of claim 14, wherein the metal cooling body includes a plurality of cavity plates, a one of the plurality of cavity plates being physically adjacent to a one of the plate pairs, and another one of the plurality of cavity plates being physically adjacent to another one of the plate pairs.

* * * * *